(12) United States Patent
Vodrahalli (10) Patent No.: US 9,870,959 B1
(45) Date of Patent: Jan. 16, 2018

(54) METHOD AND APPARATUS FOR TESTING A FLIP-CHIP ASSEMBLY DURING MANUFACTURE

(71) Applicant: Altera Corporation, San Jose, CA (US)

(72) Inventor: Nagesh Vodrahalli, Los Altos, CA (US)

(73) Assignee: ALTERA CORPORATION, San Jose, CA (US)

( * ) Notice: Subject to any disclaimer, the term of this patent is extended or adjusted under 35 U.S.C. 154(b) by 0 days.

(21) Appl. No.: 13/651,288

(22) Filed: Oct. 12, 2012

(51) Int. Cl.
*H01L 21/66* (2006.01)
*H05K 13/04* (2006.01)

(52) U.S. Cl.
CPC ............ *H01L 22/14* (2013.01); *H01L 22/32* (2013.01); *H01L 22/34* (2013.01); *H05K 13/0465* (2013.01)

(58) Field of Classification Search
CPC ....... H01L 2924/00; H01L 2924/15311; H01L 2224/94; H01L 2224/8185; H01L 24/81; H01L 2224/401; H01L 23/473; H01L 23/3738; H01L 2223/06517; H01L 2225/06517
See application file for complete search history.

(56) References Cited

U.S. PATENT DOCUMENTS

| 5,172,049 A | 12/1992 | Kiyokawa et al. |
| 5,468,994 A | 11/1995 | Pendse |
| 6,517,656 B1 | 2/2003 | DiCaprio |
| 7,345,361 B2 | 3/2008 | Mallik et al. |
| 7,883,935 B2 | 2/2011 | Kolan et al. |
| 9,201,097 B1 | 12/2015 | Vodrahalli |
| 2003/0001287 A1 | 1/2003 | Sathe |
| 2003/0151883 A1 | 8/2003 | Hauptman |

(Continued)

FOREIGN PATENT DOCUMENTS

WO    2005/089421    9/2005

OTHER PUBLICATIONS

U.S. Appl. No. 13/651,269, Notice of Allowance dated Sep. 8, 2015.

(Continued)

*Primary Examiner* — Marc Armand
*Assistant Examiner* — Quinton Brasfield
(74) *Attorney, Agent, or Firm* — Fletcher Yoder, P.C.

(57) ABSTRACT

Techniques for electrically testing a flip-chip assembly during its manufacture include a flip-chip assembly having an integrated circuit (IC) die and an IC package substrate. The IC package substrate is placed on a substrate part holder that includes test sockets and heating elements. The IC die is then placed on the placed IC package substrate. The placed IC die and IC package substrate are aligned such that conductive contacts are formed from conductive bumps and pads deposited on the surface of the IC die and IC package substrate. While the bumps and pads are in conductive contact, but prior to attachment, the flip-chip assembly is electrically tested. If the flip-chip assembly passes electrical testing, the conductive contacts may be attached by the heating elements on the substrate part holder, such as in a solder reflow process when the bumps are made from solder.

20 Claims, 4 Drawing Sheets

(56) References Cited

U.S. PATENT DOCUMENTS

| | | | |
|---|---|---|---|
| 2004/0100293 A1* | 5/2004 | Bottcher | G01R 31/2884 324/754.03 |
| 2006/0014309 A1* | 1/2006 | Sachdev | G01R 1/0466 438/17 |
| 2006/0186909 A1* | 8/2006 | Aube | G01R 31/2875 324/750.09 |
| 2009/0289253 A1* | 11/2009 | Pendse | H01L 22/32 257/48 |
| 2010/0231251 A1* | 9/2010 | Nelson | G01R 1/0466 324/755.09 |
| 2011/0024890 A1 | 2/2011 | Yang et al. | |
| 2011/0042820 A1* | 2/2011 | Knickerbocker | H01L 21/76898 257/774 |
| 2011/0062599 A1* | 3/2011 | Kim | H01L 23/49816 257/778 |
| 2011/0308080 A1* | 12/2011 | Hegde | H01L 22/12 29/832 |
| 2012/0225522 A1 | 9/2012 | Zhao et al. | |

OTHER PUBLICATIONS

U.S. Appl. No. 13/651,269, Office Action dated Feb. 26, 2015.
U.S. Appl. No. 13/651,269, "Method and apparatus for testing integrated circuit die with a partially completed and validated module," Nagesh Vodrahalli, filed Oct. 12, 2012.

* cited by examiner

METHOD AND APPARATUS FOR TESTING A FLIP-CHIP ASSEMBLY DURING MANUFACTURE

TECHNICAL FIELD

The present disclosure generally relates to flip-chip manufacturing. More specifically, the present disclosure relates to techniques and systems for electrically testing a flip-chip assembly during manufacture.

DESCRIPTION OF RELATED ART

A flip-chip assembly conventionally includes one or more integrated circuit (IC) die that is attached to a package substrate, or IC package substrate. The IC die includes interconnection bumps deposited on a surface while the package substrate includes corresponding package pads on a first surface. When the interconnection bumps and the package pads are placed in conductive contact, they allow signal transfers between the IC die and the package substrate.

In a conventional flip-chip assembly manufacture process, the IC die and package substrate are fabricated separately and assembled with a flip-chip assembly tool. The IC die is positioned on the package substrate such that the interconnection bumps are facing and aligned with the package pads. The interconnection bumps are then attached to the package pads. In one example, the interconnection bumps and package pads are made from solder. Here, heat may be applied to cause solder reflow such that the interconnection bumps permanently attach to the package pads. The flip-chip assembly may then go through a package clean process.

Next, the flip-chip assembly is electrically tested. Conventionally, testing a flip-chip assembly is conducted on a separate package test tool.

If the flip-chip assembly fails electrical testing, it may be placed in a rework process in which the IC die is removed from the package substrate. This process is costly, and oftentimes, it is economically preferable to discard the entire flip-chip assembly. Another solution to minimize yield loss is to pre-test individual IC die prior to packaging such that only known good die reach assembly. This solution, however, requires additional monetary and manufacturing time costs. In addition, a full functional test of the assembled flip-chip assembly may still be required, which includes checking electrical connections between the known good die and package substrate.

Overview

In some embodiments, a method in accordance with the present invention provides for electrically testing a flip-chip assembly during its manufacturing. The method may include providing an IC die and an IC package substrate that will form the flip-chip assembly. The IC die includes a surface having interconnection bumps. The IC package substrate includes package pads on a first surface for attachment to the interconnection bumps of the IC die and package bumps on a second surface. The method further includes positioning the IC package substrate on a substrate part holder such that the package bumps are facing and aligned with test socket pads on a surface of the substrate part holder. In some embodiments, the substrate part holder includes one or more heating elements.

It should be appreciated that the term "flip-chip" in the context of the present application is intended to encompass a variety of surface-to-surface die-to-substrate attach technologies. These include conventional solder bump-based flip chip technologies, such as C4 technology, as well as related technologies using lead-free or conductive epoxy materials, for example, as alternatives to conventional solder, and also copper pillar bump (CPB) technology. "Flip-chip" should be attributed this broad meaning in this application.

The method further includes positioning the IC die on the IC package substrate such that the interconnection bumps are facing and aligned with the package pads of the IC package substrate. The positioned IC die and IC package substrate form the flip-chip assembly. Next, prior to applying heat to the flip-chip assembly to attach the interconnection bumps of the IC die to the package pads of the package substrate, the method further includes electrically testing the flip-chip assembly via the test socket pads of the substrate part holder.

In some embodiments, the method further includes applying pressure to the positioned IC package substrate such that the IC package substrate is held in position on the surface of the substrate part holder and the package bumps make conductive contact with the test socket pads; and applying pressure to the positioned IC die such that the IC die is held in position on the second surface of the IC package substrate and the interconnection bumps make conductive contact with the package pads.

In some embodiments, applying pressure to the positioned IC package substrate such that the IC package substrate is held in position on the surface of the substrate part holder and the package bumps make conductive contact with the test socket pads includes vacuum mounting the IC package substrate to the surface of the substrate part holder.

In some embodiments, applying pressure to the positioned IC die such that the IC die is held in position on the second surface of the IC package substrate and the interconnection bumps make conductive contact with the package pads includes applying pressure to on the positioned IC die with a pick and place tool that also performs the positioning of the IC die on the IC package substrate.

In some embodiments, applying pressure to the positioned IC package substrate or applying pressure to the positioned IC die is performed with a clamp.

In some embodiments, applying pressure to the positioned IC die includes applying pressure to the positioned IC die such that insulating flux between the IC die and the IC packaged substrate is moved to allow the interconnection bumps to make the conductive contact with the package pads.

In some embodiments, the method further includes applying heat, with the substrate part holder, to attach the interconnection bumps of the IC die to the package pads of the package substrate if the flip-chip assembly passed electrical testing. The method may further include underfilling the IC die of the flip-chip assembly.

In some embodiments, the interconnection bumps of the IC die are made from solder. Here, applying heat to attach the interconnection bumps of the IC die to the package pads of the package substrate includes reflowing the solder. In other embodiments, the interconnection bumps may be composed of copper or copper with a layer of solder.

In some embodiments, the method further includes lifting the IC die from the IC package substrate if the flip-chip assembly does not pass electrical testing. This allows a second IC die to be positioned on the IC package substrate in the place of the first IC die.

In some embodiments, the IC package substrate includes an interposer and the first surface of the IC package substrate is a surface of the interposer.

In some embodiments, an integrated test and assembly apparatus provides for electrically testing a flip-chip assembly during its manufacture. The integrated test and assembly apparatus includes a substrate part holder, a pick and place tool and test circuitry.

The substrate part holder includes test socket pads on a surface of the substrate part holder and one or more heating elements operable or configured to heat the surface of the substrate part holder to attach an IC die to an IC package substrate. The pick and place tool is configured to: position the IC package substrate on the substrate part holder such that package bumps on a first surface of the IC package substrate are facing and aligned with the test socket pads of the substrate part holder, and position the IC die on the IC package substrate such that interconnection bumps on a surface of the IC die are facing and aligned with package pads on a second surface of the IC package substrate, the positioned IC die and IC package substrate forming the flip-chip assembly. Test circuitry is connected with the test socket pads of the substrate part holder and operable or configured to electrically test the flip-chip assembly before the IC die is attached to the IC package substrate by heating via the surface of the substrate part holder.

In some embodiments, the apparatus further includes one or more pressure application mechanisms configured to: apply pressure to the positioned package substrate such that the package substrate is held in position on the surface of the substrate part holder and the package bumps make conductive contact with the test socket pads; and apply pressure to the positioned IC die such that the IC die is held in position on the second surface of the package substrate and the interconnection bumps make conductive contact with the package pads.

In some embodiments, one of the one or more pressure application mechanisms configured to apply pressure to the positioned package substrate is a vacuum mount. In some embodiments, one of the one or more pressure application mechanisms configured to apply pressure to the positioned IC die is the pick and place tool. In some embodiments, one of the one or more pressure application mechanisms is a clamp.

In some embodiments, one of the one or more pressure application mechanisms are configured to apply pressure to the positioned IC die such that insulating flux between the IC die and the IC packaged substrate is moved to allow the interconnection bumps to make the conductive contact with the package pads.

In some embodiments, the substrate part holder is configured to apply heat utilizing the one or more heating elements to attach the interconnection bumps of the IC die to the package pads of the package substrate if the flip-chip assembly passed electrical testing. The apparatus may be further configured to underfill the IC die of the flip-chip assembly.

In some embodiments, the interconnection bumps of the IC die are made from solder. Here, the substrate part holder is configured to apply heat to attach the interconnection bumps of the IC die to the package pads of the package substrate by solder reflow. In other embodiments, the interconnection bumps may be composed of copper or copper with a layer of solder.

In some embodiments, the pick and place tool is further configured to lift the IC die from the IC package substrate if the flip-chip assembly did not pass electrical testing. This allows a second IC die to be positioned on the IC package substrate.

In some embodiments, the IC package substrate includes an interposer and the first surface of the IC package substrate is a surface of the interposer.

In some embodiments, a system provides for electrically testing a flip-chip assembly during its manufacture. The system includes a substrate part holder, a pick and place tool and test circuitry. In addition, the system includes a controller comprising one or more memory devices and one or more processors, the one or more memory devices storing instructions executable by the one or more processors such that the controller is configured to control the substrate part holder, the pick and place tool, the test circuitry and any other components discussed herein to provide the described functionalities.

In other embodiments, a flip chip made by a process comprising testing and further comprising assembly as described herein is provided.

Accordingly, an integrated IC test and assembly apparatus, technique and system provides for electrically testing a flip-chip assembly during its manufacture, allowing for cost-effective electrical testing of a flip-chip assembly prior to attachment of the IC die to the package substrate.

BRIEF DESCRIPTION OF THE DRAWINGS

The included drawings are for illustrative purposes and serve only to provide examples of possible structures and process steps for the disclosed subject matter. These drawings in no way limit any changes in form and detail that may be made to embodiments by one skilled in the art without departing from the spirit and scope of the disclosure.

DESCRIPTION OF PARTICULAR EMBODIMENTS

Reference will now be made in detail to embodiments of the present invention. Examples of these embodiments are illustrated in the accompanying drawings. While the invention is described in conjunction with these embodiments, it will be understood that it is not intended to limit the invention to the described embodiments. On the contrary, it is intended to cover alternatives, modifications, and equivalents as may be included within the spirit and scope of the invention as defined by the appended claims.

For example, the techniques and mechanisms of the present invention will be described in the context of particular types of devices. However, it should be noted that the techniques and mechanisms of the present invention apply to a variety of different types of devices. In the following description, numerous specific details are set forth in order to provide a thorough understanding of the present invention. Particular exemplary embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that various embodiments may include multiple iterations of a technique or multiple instantiations of a mechanism unless noted otherwise. For example, a system may use a processor in a variety of contexts. However, it will be appreciated that a system can use multiple processors while remaining within the scope of the present invention unless otherwise noted. Furthermore, the techniques and mechanisms of the present invention will sometimes describe a connection between two entities. It should be noted that a connection between two entities does not necessarily mean a direct, unimpeded connection, as a variety of other entities may reside between the two entities. For example, a processor may be connected to a memory component, but it will be appreciated that a variety of bridges and controllers may reside between the processor and memory. Consequently, a connection does not necessarily mean a direct, unimpeded connection unless otherwise noted.

Figure 1:
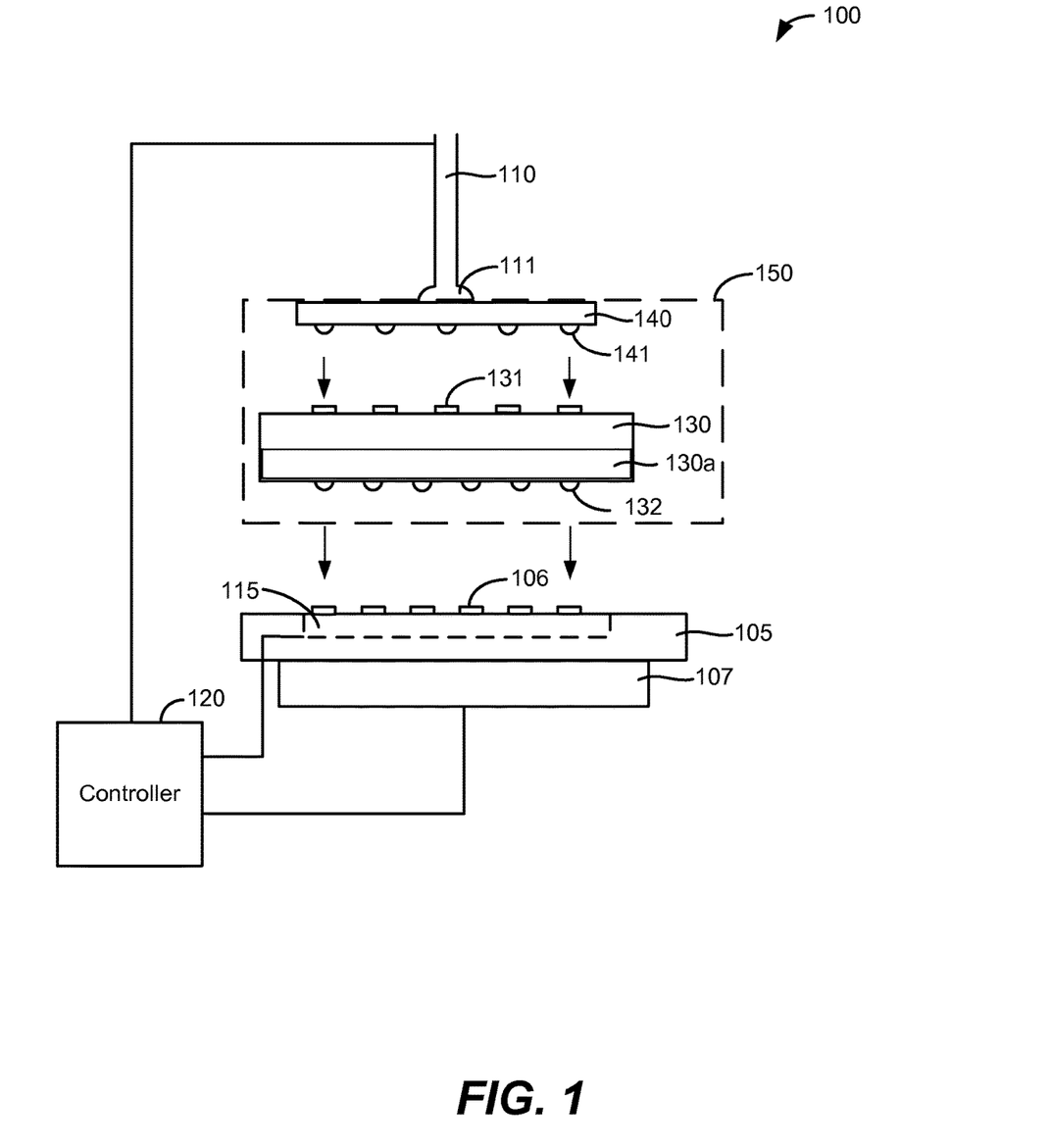
FIG. 1 shows an example of an integrated test and assembly apparatus/system configured in accordance with some embodiments.

In some embodiments, an integrated test and assembly apparatus provides for electrically testing a flip-chip assembly during its manufacture. FIG. 1 shows an example integrated test and assembly apparatus 100 (hereinafter "apparatus 100") including substrate part holder 105, pick and place tool 110, test circuitry 115 and controller 120.

As noted above, it should be appreciated that the term "flip-chip" in the context of the present application is intended to encompass a variety of surface-to-surface die-to-substrate attach technologies. These include conventional solder bump-based flip chip technologies, such as C4 technology, as well as related technologies using lead-free or conductive epoxy materials, for example, as alternatives to conventional solder, and also copper pillar bump (CPB) technology. "Flip-chip" should be attributed this broad meaning in this application.

FIG. 1 also includes IC die 140 and IC package substrate 130. IC die 140 includes a surface having interconnection bumps 141 deposited thereon. IC package substrate 130 includes package pads 131 on a first surface for attachment to interconnection bumps 141 of IC die 140 and package bumps 132 on a second surface for attachment to test socket pads 106 of substrate part holder 105.

When IC die 140 is positioned on IC package substrate 130 such that interconnection bumps 141 are facing, aligned and in conductive contact with package pads 131, IC die 140 and IC package substrate 130 form flip-chip assembly 150.

While FIG. 1 shows a single IC die 140, it will be appreciated that the disclosed subject matter applies equally to multi-die packages, wherein a plurality of IC dice are placed on an IC package substrate. In addition, IC package substrate 130 may be any type of substrate in which an IC die may be attached. In one example, IC package substrate 130 is a 2D system-in-package (SIP) substrate. In another example, IC package substrate 130 is 2.5D substrate that includes an interposer 130a, such as a silicon interposer with through-silicon vias (TSV's). In another example, IC package substrate 130 is a printed circuit board (PCB) in which an IC die may be directly attached.

"Bumps," as used in the art, typically refer to small spheres of conductive material that may contact or bond to conductive contact areas, or "pads." For instance, FIG. 1 shows IC die 140 including interconnection bumps 141 that may bond to package pads 131 of package substrate 130. The conductive material may be made from solder in a preferred embodiment, but other materials may also be used such as conductive epoxies. Furthermore, other structures may be used to form the conductive contacts. For instance, an IC die may include bumps that bond to pads of an IC package substrate. In another example, other structures besides spherical balls may be used to form bumps. Thus as used herein, "bumps" and "pads" may refer to conductive material having a variety of possible structures that are deposited on surfaces for forming conductive contacts and mechanical attachments. In specific embodiments, bumps are made of solder or other material that can be reflowed by application of heat to form a permanent bond with substrate pads.

Returning to FIG. 1, in some embodiments apparatus 100 may include a controller configured to implement a system for electrically testing a flip-chip assembly during its manufacture on the apparatus. Controller 120 may be a computing device that is configured to control operation of apparatus 100 and its components. In one example, controller 120 may include one or more memory devices and one or more processors. The one or more memory devices may store instruction, such as computer code, that are executable by the one or more processors to control apparatus 100 in performing methods 200, 300 and 400, discussed below with reference to FIGS. 2, 3 and 4 respectively.

Pick and place tool 110 may be operable or configured, such as by controller 120, to pick up IC package substrate 130 (e.g., from a stack of IC package substrates) and to place it onto substrate part holder 105 or to pick up IC die 140 (e.g., from a stack of IC dice) and to place the die onto package substrate 130. In addition, pick and place tool 110 may also be operable or configured to lift IC die 140 from IC package substrate 130 or to lift IC package substrate 130 from substrate part holder 105. In one example, pick and place tool 110 includes a suction device 111 to which IC dice and IC package substrates may attach. However, other pick and place techniques known in the art besides vacuum suction may also be used for pick and place tool 110.

In some embodiments, pick and place tool 110 may also be operable or configured to apply pressure to a positioned IC die. For instance, pick and place tool 110 may be operable or configured to press down on IC die 140 after it has positioned IC die 140 on IC package substrate 130. Via this technique, IC die 140 is held in position on IC package substrate 130 and reliable conductive contact is made between interconnection bumps 131 and package pads 131 in a vertical arrangement for electrical testing. In other embodiments, clamps or other mechanical mechanisms on substrate part holder 105 may be used for applying pressure to IC die 140. In various embodiments, a clamp may be a flat piece of material (e.g., metal) that interfaces with the die and the pressure applying arm. The flat piece helps to distribute pressure uniformly. Pressure can be applied onto this flat piece in different ways (e.g., spring loading, clamping (a regular clamp designed to deliver certain loads, etc.), as is common in the industry. A variety of clamps may be used, from simple mechanical clamps to wafer level bonders that apply uniform pressure across an entire wafer.

Substrate part holder 105 provides a platform on which flip-chip IC die 140 and IC package substrate 130 may be placed for testing and assembly. Test socket pads 106 may be located on the top surface of substrate part holder 105 and configured such that package bumps 131 of IC package substrate 130 may be aligned for conductive contact when IC package substrate 130 is placed on substrate part holder 105.

In some embodiments, substrate part holder 105 also includes one or more vacuum mounts (not shown) that are operable or configured to suction IC package substrate 130 to substrate part holder 105. Via suctioning, the one or more vacuum mounts apply pressure that holds IC package substrate 130 in position on substrate part holder 105. In addition, the one or more vacuum mounts may be configured to apply a sufficient amount of pressure such that package bumps 132 make reliable conductive contact with test socket pads 106 for electrical testing. In other embodiments, substrate part holder 105 may include clamps or other mechanical mechanisms for applying pressure to IC package substrate 130.

In particular embodiments, IC die 140, package substrate 103 and substrate part holder 105 are arranged in a stack (e.g., a vertical stacked arrangement) such that the application of pressure to one or more of the various components to obtain electrical contact can be done in a simple, direct way that enhances workflow and the likelihood of a reliable electrical connection at all suitable points without damage to any component.

Test circuitry 115 may connect test socket pads 106 with controller 120. Test circuitry 115 is operable or configured by controller 120 to electrically test flip-chip assembly 150 when it is positioned on substrate part holder 105.

Substrate part holder 105 further includes heating element 107. Heating element 107 may be configured such that controller 120 is able to determine and control the temperature of substrate part holder 105, and in turn, the temperature of flip-chip assembly 150 when it is placed on substrate part holder 105. Via heating of flip-chip assembly 150, IC die 140 may be attached to IC package substrate 130. In one example, interconnection bumps 141 of IC die 140 and package pads 131 of IC package substrate 130 are made from solder. Here, heating up substrate part holder 105 causes solder reflow and results in interconnection bumps 141 forming attachments to package pads 131.

Figure 2:
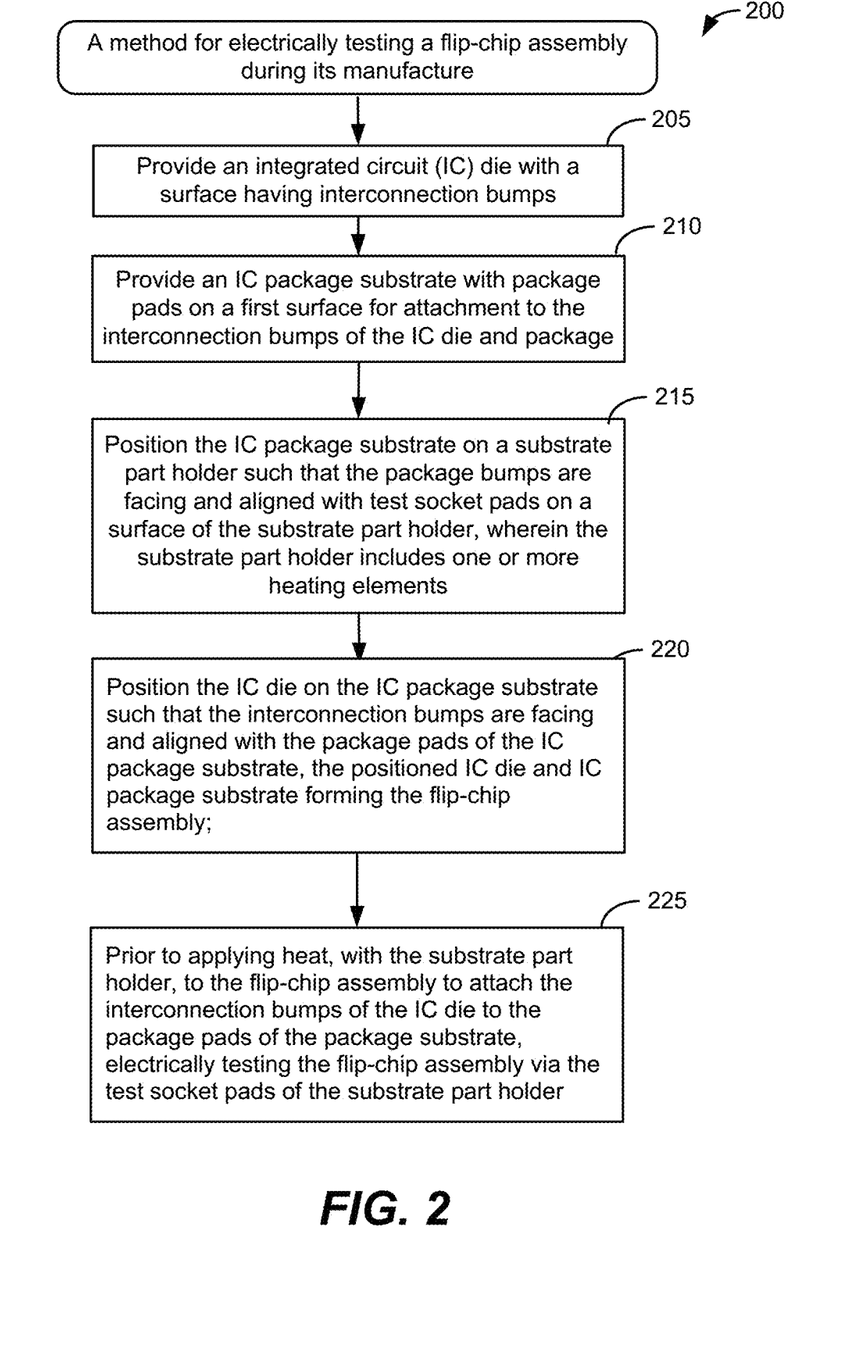
FIG. 2 shows an example of a method for electrically testing a flip-chip assembly during its manufacture, performed in accordance with some embodiments.

FIG. 2 shows an example of a method 200 for electrically testing a flip-chip assembly during its manufacture, performed in accordance with some embodiments. In block 205, an IC die with a surface having interconnection bumps is provided. The IC die may be any type of die, including Dynamic Random Access Memory (DRAM) dice, Static Ram (SRAM) dice, Synchronous DRAM (SDRAM) dice, microprocessor dice, Application Specific Integrated Circuit (ASIC) dice, Digital Signal Processor (DSP) dice and Field Programmable Logic Array (FPGA) dice.

The interconnection bumps of the IC die provide conductive paths from the IC die to an IC package substrate, mechanical attachment of the IC die to the IC package substrate, as well as a variety of other functions in a flip-chip assembly.

In block 210, an IC package substrate is provided. The IC package substrate may include package pads on a first surface for attachment to the interconnection bumps of the IC die. The IC package substrate may also include package bumps on a second surface.

As discussed, the package pads of the IC package substrate are configured to attach to the interconnection bumps of the IC die, provided in block 210. In some embodiments, the interconnections bumps and package pads are arranged in a common pattern on the respective surfaces of the IC die and the IC package substrate.

Also as discussed, the IC package substrate includes package bumps on a second surface, opposite the surface including the package pads. The package bumps may be configured such that they are capable of being attached to a PCB. The PCB may include PCB pads on a surface that are arranged in a common pattern with the package bumps, thus allowing a flip-chip assembly including the IC package substrate to communicate signals with the PCB when the flip-chip assembly is conductively attached to the PCB via the package bumps and PCB pads.

In block 215, the IC package substrate is positioned on a substrate part holder such that the package bumps are facing and aligned with test socket pads on a surface of the substrate part holder.

The IC package substrate includes package bumps on the second surface, thus the IC package substrate may be placed on the substrate part holder such that the second surface faces the top surface of the substrate part holder where the test socket pads are located.

The test socket pads are arranged on the surface of the substrate part holder in a common pattern with the package bumps. This allows the test socket pads to interface with the IC package substrate in a similar fashion as the PCB board might interface with the IC package substrate post-production. Pressure may be applied to the die, package and/or substrate part holder to enhance the electrical connections between them, as discussed above and further below. However, the IC package substrate is not permanently attached to the test socket pads as it is eventually be attached to a PCB board in some embodiments.

In some embodiments, positioning the IC package substrate in block 215 includes picking an IC package substrate from a stack or other arrangement of IC package substrates, such as in an assembly line process. Positioning the IC package substrate may also include placing the IC package substrate on the substrate part holder after it has been packed up from the stack. In some embodiments, pick and place tool 110 or the like may be used for the picking and placing of IC package substrates.

In some embodiments, the substrate part holder on which the IC package substrate is positioned further includes one or more heating elements. However, the heating elements are not used in block 215.

In block 220, the IC die is positioned on the IC package substrate. The IC die may be positioned such that the interconnection bumps of the IC die are facing and aligned with the package pads of the IC package substrate.

In some embodiments, the IC die is picked from a stack of IC dice and placed on the IC package substrate as part of the assembly line process. Pick and place tool 110 or the like may also be used in block 220.

When the IC package substrate is positioned on the substrate part holder in block 215 and the IC die is positioned on the IC package substrate in block 220, the positioned IC die and IC package substrate form a "flip-chip assembly," as used herein.

In block 225, the flip-chip assembly is electrically tested prior to being heated to attach the interconnection bumps of the IC die to the package pads of the package substrate. Electrically testing the flip-chip assembly before the conductive contacts are attached, such as by a solder reflow process if the contacts are made from solder, allows failed components to be discarded with minimized yield loss to working components. It also prevents the need for any costly repair or removal process that may be required to detach conductive contacts between working components and failed components.

In some embodiments, the electrical test in block 225 is the first electrical test that is performed on the positioned IC die or the positioned IC package substrate. Here, a full functional test may be performed which may include testing the functionality of the IC die, the IC package substrate and the interconnections formed by the conductive contacts. Testing the interconnections may include testing the conductive contacts formed by the interconnection pumps of the IC die with the package pads of the IC package substrate. It may also include testing the package bumps of the IC package substrate for connection with a PCB board.

In some embodiments, the IC die or the IC package substrate has already been electrically tested as individual components. Here, only known good substrates or die are positioned on the substrate part holder in blocks 215 and 220. A full functional test may still be performed. If the individual die and substrate are known to be good, however, it may be desirable to only test interconnections.

In some embodiments, only one of the IC die or the IC package substrate is pre-tested. For instance, if the IC package substrate is known to be good, then the functionality of the IC die and interconnections may be tested. This embodiment may be desirable in many instances because it may be difficult to determine in some instances whether the IC die or the IC package substrate is responsible for a failed electrical test.

In general, the electrical test in block 225 may be configured based on the needs of the manufacturer. The electrical test should be designed such that performing the test will determine whether the flip-chip assembly is suitable for permanently assembly. As discussed, however, the flip-chip assembly is not yet actually assembled.

In some embodiments, substrate part holder 105, test socket pads 106, test circuitry 115 and controller 120 shown in FIG. 1 are used to perform electrical testing in block 225. Here, the flip-chip assembly is placed on substrate part holder 105 with its package bumps in conductive contact with test socket pads 106. Controller 120 may store and execute computer readable instructions to control test circuitry 115 to perform the electrical testing. The instructions may also provide for control of heating element 107 and may be configured such that heating element 107 does not heat substrate part holder 105 prior to the electrical testing. The results of the electrical testing may be stored in controller 120, or some other memory device, for subsequent use.

Figure 3:
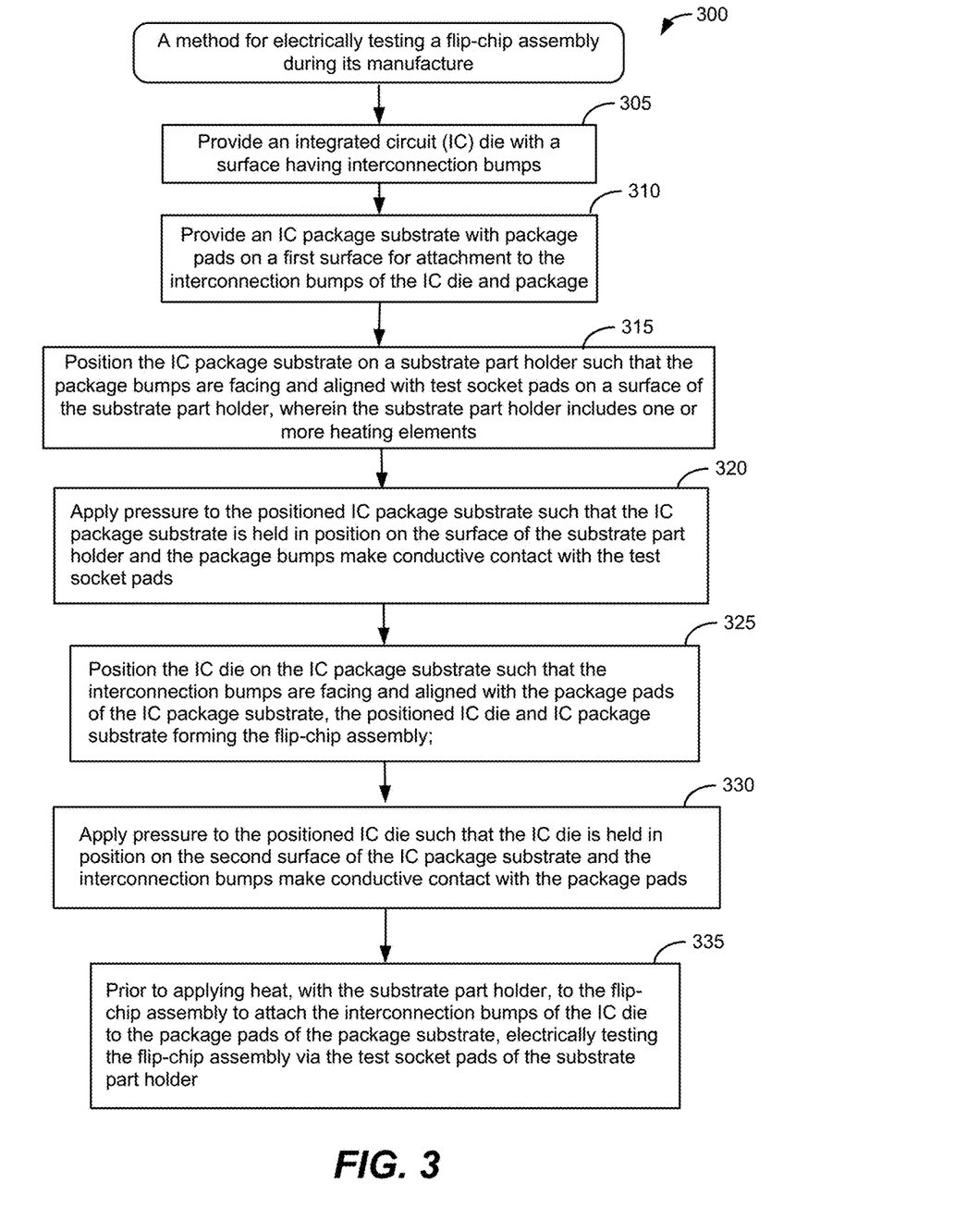
FIG. 3 shows an example of a method for electrically testing a flip-chip assembly during its manufacture, performed in accordance with some embodiments.

FIG. 3 shows an example of a method 300 for electrically testing a flip-chip assembly during its manufacture, performed in accordance with some embodiments. Method 300 is similar to method 200, but includes additional steps applicable to some embodiments.

Blocks 305-315 proceed similar to blocks 205-215, wherein an IC die is provided, an IC package substrate is provided, and the IC package substrate is positioned on a substrate part holder.

In some embodiments, the conductive contacts (e.g., interconnection bumps) of the IC die and the IC package substrate are made from solder in method 300. Solder is desirable in that it is capable of forming reliable conductive connections between two unattached conductive contacts (e.g., a bump and a pad) when sufficient pressure is applied to press the unattached conductive contacts against each other. Conductive materials that require curing, reflow or permanent attachment before reliable conductive connections form are less desirable. It will be appreciated, however, that the disclosed embodiments are not limited to solder and that other materials may be used.

In block 320, pressure is applied to the IC package substrate positioned on the surface of the substrate part holder. The pressure may serve a dual mechanical and electrical purpose. First, the pressure may hold the IC package substrate in position on the surface of the substrate part holder so that the package bumps remain aligned with the test socket pads. Second, the pressure may ensure that the package bumps make and retain conductive contact with the test socket pads. The pressure should be sufficient to flatten the package substrate so that all test socket pads are in contact with their respective package bumps, and so that a good electrical contact is made between the bumps and pads. The amount of pressure that is sufficient may vary based on substrate composition, modulus and warpage, but would be readily determinable by one skilled in the art given the disclosure provided herein.

In some embodiments, substrate part holder 105 shown in FIG. 1 applies the pressure in block 320. In one example, substrate part holder includes one or more vacuum mounts that apply the pressure. A vacuum mount may include a hole on the surface of the substrate part holder that suctions the IC package substrate to the surface of the substrate part holder. Controller 120 may be configured to control the amount of pressure applied by the vacuum mounts such that it is sufficient to hold the IC package substrate and retain the conductive contacts.

In some embodiments, structures other than vacuum mounts on the substrate part holder may be used. For instance, clamps or other mechanical mechanisms may apply a pressure from above the IC package substrate that presses the IC package substrate down on the substrate part holder. The mechanical mechanism may be part of the substrate part holder, or some other component. In some embodiments, magnetic force may also be used to apply the pressure.

In block 325, the IC die is positioned on the IC package substrate such that the interconnection bumps are facing and aligned with the package pads of the IC package substrate. The discussion above regarding block 220 in method 200 may also be applicable to block 325.

In some embodiments, the interconnection bumps are made from solder. Here, the surface of the IC die including the interconnection bumps may be coated with flux prior to block 325 to prevent oxidation during subsequent solder reflow. The flux may be made from an organic, non-conductive material and may be applied by virtually any technique, including spray, brush, dip or the like. In another embodiment, the flux is applied to the surface of the positioned IC package substrate after block 315 or 320, prior to positioning the IC die on the IC package substrate.

In block 330, pressure is applied to the positioned IC die on the surface of the IC package substrate. Here, the pressure may also serve a dual mechanical and electrical purpose. First, the pressure may hold the IC die in position on the surface of the IC package substrate so that the interconnection bumps remain aligned with the package pads. Second, the pressure may ensure that the interconnection bumps make and retain conductive contact with the package pads. In many embodiments, the pressure applied in block 330 is less than the pressure applied in block 320, particularly where the die has a much smaller surface area than the package substrate.

In some embodiments, if the surface of the IC die including the interconnection bumps is coated with flux, the pressure may also move the flux away from the conductive contacts, thus further ensuring that the conductive contacts form. In the case where the conductive contacts are made from solder, a flux layer may be needed to prevent oxidation of the solder during reflow. Thus applying pressure to the positioned IC may be particularly important for this additional purpose in block 330 for conductive contacts made from solder.

In some embodiments, pick and place tool 110 applies the pressure in block 320. As discussed above with respect to block 220 in method 200, pick and place tool 110 may be used to place the IC die on the surface of the IC package substrate in block 325. In one example, pick and place tool 110 may remain attached with the IC die after placement so that it may press down on the IC die and apply pressure. As discussed, controller 120 may be configured to control pick and place tool 110, which here includes controlling the amount of pressure that pick and place tool 110 applies to the IC die in block 330.

In other embodiments, other components may be used to apply the pressure other than pick and place tool 110. In one example, a second set of clamps or mechanical mechanisms may be used that presses the IC die on the IC package substrate. Magnetic and vacuum force may also be used.

In block 335, the flip-chip assembly is electrically tested prior to being heated to attach the interconnection bumps of the IC die to the package pads of the package substrate. The discussion above regarding block 225 may also be applicable to block 335.

Figure 4:
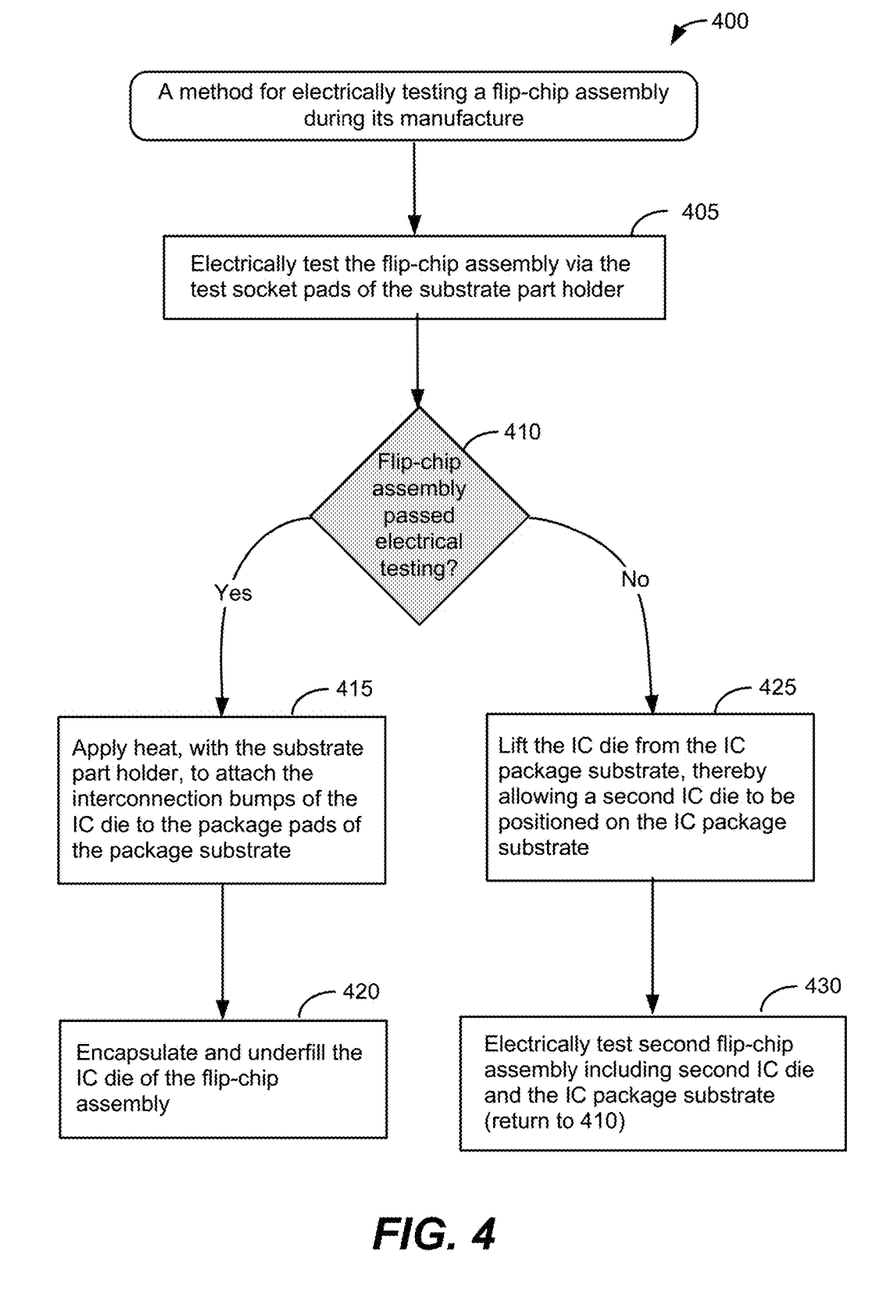
FIG. 4 shows an example of a method for electrically testing a flip-chip assembly during its manufacture, performed in accordance with some embodiments.

FIG. 4 shows an example of a method 400 for electrically testing a flip-chip assembly during its manufacture, performed in accordance with some embodiments. In block 405, the flip-chip assembly is placed on the substrate part holder and electrically tested using techniques similar to those discussed in methods 200 and 300.

In determination block 410, it is determined whether the flip-chip assembly passed electrical testing. If the flip-chip assembly has passed electrical testing, the method proceeds to block 415 where heat is applied to attach the interconnection bumps of the IC die to the package pads of the IC package substrate.

In some embodiments, method 400 is performed with apparatus 100 shown in FIG. 1. Here, substrate part holder 105 includes one or more heating elements 107 which are controlled by controller 120. Heating elements 107 are configured such that substrate part holder 105 may apply controlled heating to the positioned flip-chip assembly. The heating should be at a rate and a temperature that is sufficient to make conductive contacts between the IC die and the IC package substrate form attachments. However, the temperature should be maintained such that the package bumps of the IC package substrate do not form attachments with test socket pads 106 of substrate part holder 105. In addition, the temperature should be maintained such that the IC die, IC package substrate and various interconnections are not damaged or otherwise functionally altered.

In some embodiments, the interconnection bumps of the IC die are made from solder. Here, applying heat in block 415 causes the solder to reflow, thus forming attachments between the interconnection bumps and the package pads.

In block 420, the IC die may be underfilled with a non-conductive adhesive material that provides mechanical support and protection. At this point, the flip chip assembly may be complete. In some embodiments, a final electrical test may also be performed to ensure that the attachment process did not damage the flip-chip assembly. This final electrical test, if performed, may be performed before or after block 420.

After block 420, the flip-chip assembly, including the IC die attached with the IC package substrate, may be lifted from the substrate part holder, such as by pick and place tool 110. Method 200 may then be performed, where a second IC package substrate is placed on the substrate part holder and a second IC die is placed on the placed IC package substrate for electrical testing prior to attaching the second IC die to the second IC package substrate.

If the flip-chip assembly did not pass electrical testing in block 405, method 400 proceeds to block 425. Here, the IC die is lifted from the IC package substrate, thus allowing a second IC die to be positioned on the IC package substrate. Because the IC die was not attached to the IC package substrate in prior blocks, the IC die may be easily removed.

In some implementations, lifting the IC die is performed by pick and place tool 110 shown in FIG. 1. Under the control of processor 120, pick and place tool 110 may lift the IC die from the IC package substrate. It may further discard the IC die and lift a second IC die from the stack. The second IC die may be positioned on the IC package substrate and tested like the first IC die. Method 400 may then be repeated for the second IC die at block 405, where the flip-chip assembly including the second IC die is electrically tested.

For method 400 as described, the IC package substrate is assumed to be good while the IC die is replaced if electrical testing fails. In one example, the IC package substrate has already been pre-tested, thus any failure in electrical testing may be attributed to the IC die. In another example, however, it may be cost-effective to discard the entire flip-chip assembly in the case of a failed electrical test rather than to pre-test IC package substrates. Here, block 425 may include lifting the entire flip-chip assembly, including the IC die and the IC package substrate, from the substrate part holder and repeating methods 200 or 300 for a second IC die and a second IC package substrate in block 430. Even if the entire flip-chip assembly is discarded, however, the disclosed techniques allow for cost savings because the flip-chip assembly is tested before it is processed further during attachment, underfilling, or any other conventional pre-test steps.

While methods 200, 300 and 400 described above all refer to a single IC die on a package substrate, it will be appreciated that the disclosed methods and apparatus are applicable to multi-die packages. In general, the disclosed techniques allow an IC die to be tested as part of a flip-chip assembly prior to attachment of the IC die to the IC package substrate.

In one example, a first IC die may be placed on a multi-die IC package substrate that positioned on the substrate part holder, such as substrate part holder 110 shown in FIG. 1. Prior to attachment, the first IC die may be tested. If the test is passed, the first IC die may be attached. Next, a second IC die may be placed on the multi-die IC package substrate and tested. Here, interconnections between the second IC die, the first IC die and the multi-die IC package substrate may also be tested. If the second IC die passes, the second IC die may then be attached. The process may be repeated for any number of IC die on a multi-die IC package substrate.

In another example, each IC die may be placed on the multi-die IC package substrate prior to attachment of any of the IC die. If the flip-chip assembly passes electrical testing, all of the IC die may then be attached to the multi-die IC package substrate. This technique may be desirable because there is only a single heating process for attachment. However, if the flip-chip assembly fails testing, it may be difficult to determine which of the IC dice may have caused errors.

As discussed, the described techniques may be performed by apparatus 100 shown in FIG. 1. Via apparatus 100, testing and assembly is performed on a single substrate part holder 105. This simplifies the IC manufacturing process and allows the conventional order of assembly followed by functional test to be replaced with a more efficient, streamlined, reliable and cost-effective process.

Although many of the components and processes are described above in the singular for convenience, it will be appreciated by one of skill in the art that multiple components and repeated processes can also be used to practice the techniques of the present invention.

While particular embodiments of the invention have been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

What is claimed is:

1. A method for electrically testing a flip-chip assembly during its manufacture, the method comprising:
    providing an integrated circuit (IC) die with a surface having interconnection bumps;
    providing an IC package substrate with package pads on a first surface for attachment to the interconnection bumps of the IC die and package bumps on a second surface;
    positioning the IC package substrate on a substrate part holder such that the package bumps are facing, aligned with and in conductive contact with test socket pads on a surface of the substrate part holder, wherein the substrate part holder includes one or more heating elements;
    positioning the IC die on the IC package substrate such that the interconnection bumps are facing, aligned with and in direct conductive contact with the package pads of the IC package substrate, the positioned IC die and IC package substrate forming the flip-chip assembly comprising the IC die in conductive contact with the package pads of the IC package substrate, but unattached to the IC package substrate;
    prior to attaching the interconnection bumps of the IC die to the package pads of the package substrate and prior to actively applying heat using the one or more heating elements, electrically testing the flip-chip assembly via the test socket pads of the substrate part holder to confirm conductive contacts allowing signal transfer between the IC die and the IC package substrate by placing the interconnection bumps and the package pads in unattached conductive contact to allow signal transfers between the IC die and the IC package substrate.

2. The method of claim 1, further comprising:
    applying pressure to the positioned IC package substrate such that the IC package substrate is held in position on the surface of the substrate part holder and the package bumps make conductive contact with the test socket pads; and
    applying pressure to the positioned IC die such that the IC die is held in position on the second surface of the IC package substrate and the interconnection bumps make conductive contact with the package pads.

3. The method of claim 2, wherein applying pressure to the positioned IC package substrate such that the IC package substrate is held in position on the surface of the substrate part holder and the package bumps make conductive contact with the test socket pads includes vacuum mounting the IC package substrate to the surface of the substrate part holder.

4. The method of claim 2, wherein applying pressure to the positioned IC die such that the IC die is held in position on the second surface of the IC package substrate and the interconnection bumps make conductive contact with the package pads includes applying pressure to the positioned IC die with a pick and place tool that also performs the positioning of the IC die on
    the IC package substrate.

5. The method of claim 2, wherein applying pressure to the positioned IC package substrate or applying pressure to the positioned IC die is performed with a clamp.

6. The method of claim 2, wherein applying pressure to the positioned IC die includes applying pressure to the positioned IC die such that insulating flux between the IC die and the IC packaged substrate is moved to allow the interconnection bumps to make the conductive contact with the package pads.

7. The method of claim 1, further comprising:
    responsive to the flip-chip assembly passing electrical testing, applying heat, with the substrate part holder, to attach the interconnection bumps of the IC die to the package pads of the package substrate.

8. The method of claim 7, further comprising:
    responsive to the flip-chip assembly passing electrical testing, underfilling the IC die of the flip-chip assembly.

9. The method of claim 7, wherein the interconnection bumps of the IC die are made from solder and wherein applying heat, with the substrate part holder, to attach the interconnection bumps of the IC die to the package pads of the package substrate includes reflowing the solder.

10. The method of claim 1, further comprising:
    responsive to the flip-chip assembly not passing electrical testing, lifting the IC die from the IC package substrate, thereby allowing a second IC die to be positioned on the IC package substrate.

11. The method of claim 1, wherein the IC package substrate includes an interposer and the first surface of the IC package substrate is a surface of the interposer.

12. A flip-chip assembly, the flip chip assembly made by a process comprising electrical testing during its manufacture, by a method comprising:
    providing an integrated circuit (IC) die with a surface having interconnection bumps;
    providing an IC package substrate with package pads on a first surface for attachment to the interconnection bumps of the IC die and package bumps on a second surface;
    positioning the IC package substrate on a substrate part holder such that the package bumps are facing, aligned with and in conductive contact with test socket pads on a surface of the substrate part holder, wherein the substrate part holder includes one or more heating elements;
    positioning the IC die on the IC package substrate such that the interconnection bumps are facing, aligned with and in direct conductive contact with the package pads of the IC package substrate, the positioned IC die and IC package substrate forming the flip-chip assembly comprising the IC die in conductive contact with the package pads of the IC package substrate, but unattached to the IC package substrate;
    prior to attaching the interconnection bumps of the IC die to the package pads of the package substrate and prior to actively applying heat using the one or more heating elements, electrically testing the flip-chip assembly via the test socket pads of the substrate part holder to confirm conductive contacts allowing signal transfer between the IC die and the IC package substrate by placing the interconnection bumps and the package pads in unattached conductive contact to allow signal transfers between the IC die and the IC package substrate.

13. The flip chip assembly of claim 12, further comprising wherein responsive to the flip-chip test assembly passing electrical testing, the flip chip is made by an assembly process comprising applying heat, with the substrate part holder, to attach the interconnection bumps of the IC die to the package pads of the package substrate.

14. An apparatus for electrically testing a flip-chip assembly during its manufacture, the apparatus comprising:
a controller comprising one or more memory devices and one or more processors, the one or more memory devices storing instructions executable by the one or more processors to control a substrate part holder, a pick and place tool, and test circuitry to conduct a process according to claim 1, comprising:
providing an integrated circuit (IC) die with a surface having interconnection bumps;
providing an IC package substrate with package pads on a first surface for attachment to the interconnection bumps of the IC die and package bumps on a second surface;
positioning the IC package substrate on a substrate part holder such that the package bumps are facing, aligned with and in conductive contact with test socket pads on a surface of the substrate part holder, wherein the substrate part holder includes one or more heating elements;
positioning the IC die on the IC package substrate such that the interconnection bumps are facing, aligned with and in direct conductive contact with the package pads of the IC package substrate, the positioned IC die and IC package substrate forming the flip-chip assembly comprising the IC die in conductive contact with the package pads of the IC package substrate, but unattached to the IC package substrate;
prior to attaching the interconnection bumps of the IC die to the package pads of the package substrate and prior to actively applying heat using the one or more heating elements, electrically testing the flip-chip assembly via the test socket pads of the substrate part holder to confirm conductive contacts allowing signal transfer between the IC die and the IC package substrate by placing the interconnection bumps and the package pads in unattached conductive contact to allow signal transfers between the IC die and the IC package substrate.

15. The apparatus of claim 14, wherein the controller further comprises instructions for:
applying pressure to the positioned IC package substrate such that the IC package substrate is held in position on the surface of the substrate part holder and the package bumps make conductive contact with the test socket pads; and
applying pressure to the positioned IC die such that the IC die is held in position on the second surface of the IC package substrate and the interconnection bumps make conductive contact with the package pads.

16. The apparatus of claim 14, wherein the controller further comprises instructions for:
applying pressure to the positioned IC package substrate such that the IC package substrate is held in position on the surface of the substrate part holder and the package bumps make conductive contact with the test socket pads by vacuum mounting the IC package substrate to the surface of the substrate part holder.

17. The apparatus of claim 15, wherein the controller further comprises instructions for:
applying pressure to the positioned IC die such that the IC die is held in position on the second surface of the IC package substrate and the interconnection bumps make conductive contact with the package pads includes applying pressure to the positioned IC die with the pick and place tool that also performs the positioning of the IC die on the IC package substrate.

18. The apparatus of claim 14, wherein the controller further comprises instructions for:
responsive to the flip-chip assembly passing electrical testing, applying heat, with the substrate part holder, to attach the interconnection bumps of the IC die to the package pads of the package substrate.

19. The apparatus of claim 18, wherein the controller further comprises instructions for:
responsive to the flip-chip assembly passing electrical testing, underfilling the IC die of the flip-chip assembly.

20. The apparatus of claim 18, wherein the controller further comprises instructions for:
responsive to the flip-chip assembly not passing electrical testing, lifting the IC die from the IC package substrate, thereby allowing a second IC die to be positioned on the IC package substrate.

* * * * *